(12) United States Patent
Shykind et al.

(10) Patent No.: US 9,596,766 B2
(45) Date of Patent: Mar. 14, 2017

(54) METHOD OF MANUFACTURING A CIRCUIT BOARD

(71) Applicant: Intel Corporation, Santa Clara, CA (US)

(72) Inventors: David N. Shykind, Buxton, OR (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 14/173,554

(22) Filed: Feb. 5, 2014

(65) Prior Publication Data

US 2014/0150257 A1    Jun. 5, 2014

Related U.S. Application Data

(60) Continuation of application No. 13/859,421, filed on Apr. 9, 2013, now Pat. No. 8,673,391, which is a
(Continued)

(51) Int. Cl.
*H05K 3/02* (2006.01)
*H05K 3/10* (2006.01)
(Continued)

(52) U.S. Cl.
CPC ............. *H05K 3/10* (2013.01); *H05K 1/0248* (2013.01); *H05K 1/0366* (2013.01);
(Continued)

(58) Field of Classification Search
CPC ............ H05K 2201/029; H05K 1/0245; Y10T 29/49155; Y10T 29/49124; Y10T 428/249927
(Continued)

(56) References Cited

U.S. PATENT DOCUMENTS

| 3,803,563 A | 4/1974 | Carlino |
| 4,568,582 A | 2/1986 | Kikuzawa et al. |

(Continued)

FOREIGN PATENT DOCUMENTS

| JP | 10117048 A | 5/1998 |
| JP | 2002236527 A | 8/2002 |

(Continued)

OTHER PUBLICATIONS

International Search Report and Written Opinion for PCT Patent Application No. PCT/US2004/026401, mailed on Jun. 3, 2005, 10 pages.

(Continued)

*Primary Examiner* — Thiem Phan
(74) *Attorney, Agent, or Firm* — Jordan IP Law, LLC

(57) ABSTRACT

A method of manufacturing a circuit board is described herein. The method may include adding a resin, forming first and second fiberglass fibers, and forming first and second signal line traces capable of transmitting electrical signals. In some examples, a ratio between fiberglass and resin material near the first signal line trace is similar to a ratio between fiberglass and resin material near the second signal line trace. In some examples, the first and second fiberglass fibers diagonally cross near the first and second signal line traces. In some examples, the first and second fiberglass fibers cross near the first and second signal line traces in a zig-zag pattern.

7 Claims, 4 Drawing Sheets

Related U.S. Application Data division of application No. 12/723,949, filed on Mar. 15, 2010, now Pat. No. 8,415,002, which is a division of application No. 11/727,279, filed on Mar. 26, 2007, now Pat. No. 7,676,917, which is a division of application No. 10/641,070, filed on Aug. 15, 2003, now Pat. No. 7,459,200.

(51) Int. Cl.
*H05K 1/03* (2006.01)
*H05K 1/02* (2006.01)
*H05K 3/00* (2006.01)

(52) U.S. Cl.
CPC ......... *H05K 1/0216* (2013.01); *H05K 1/0245* (2013.01); *H05K 3/0052* (2013.01); *H05K 2201/0187* (2013.01); *H05K 2201/029* (2013.01); *H05K 2201/09236* (2013.01); *H05K 2201/09972* (2013.01); *H05K 2203/1554* (2013.01); *Y10T 29/49117* (2015.01); *Y10T 29/49124* (2015.01); *Y10T 29/49126* (2015.01); *Y10T 29/49128* (2015.01); *Y10T 29/49155* (2015.01); *Y10T 29/49798* (2015.01); *Y10T 428/24058* (2015.01); *Y10T 428/24917* (2015.01); *Y10T 428/24994* (2015.04); *Y10T 428/249935* (2015.04); *Y10T 428/249943* (2015.04); *Y10T 428/249946* (2015.04); *Y10T 442/2926* (2015.04); *Y10T 442/2992* (2015.04); *Y10T 442/3065* (2015.04)

(58) Field of Classification Search
USPC .......... 29/846, 825, 829, 831, 850; 174/250, 174/255, 268
See application file for complete search history.

(56) References Cited

U.S. PATENT DOCUMENTS

| | | | |
|---|---|---|---|
| 4,868,038 A | 9/1989 | McCullough et al. |
| 4,875,282 A | 10/1989 | Leibowitz |
| 5,068,061 A | 11/1991 | Knobel et al. |
| 5,244,378 A | 9/1993 | Bross et al. |
| 5,275,877 A | 1/1994 | Isayev |
| 5,997,983 A | 12/1999 | Caron et al. |
| 6,304,700 B1 | 10/2001 | Brand et al. |
| 6,549,179 B2 | 4/2003 | Youngquist et al. |
| 6,683,260 B2 | 1/2004 | Shimamoto et al. |
| 7,022,919 B2 | 4/2006 | Brist et al. |
| 7,459,200 B2 | 12/2008 | McCall et al. |
| 7,676,917 B2 | 3/2010 | McCall et al. |
| 8,415,002 B2 | 4/2013 | McCall et al. |
| 8,673,391 B2 | 3/2014 | Shykind et al. |
| 2002/0017963 A1 | 2/2002 | Shimamoto et al. |
| 2004/0130877 A1 | 7/2004 | Okubora |
| 2004/0262036 A1 | 12/2004 | Brist et al. |

FOREIGN PATENT DOCUMENTS

| | | | | |
|---|---|---|---|---|
| JP | 2003218271 A | | 7/2003 | |
| WO | 03063237 A1 | | 7/2003 | |
| WO | WO 03/063237 | * | 7/2003 | ............. H05K 1/024 |
| WO | 2005018293 A2 | | 2/2005 | |
| WO | 2005018293 A3 | | 1/2007 | |

OTHER PUBLICATIONS

International Preliminary Report on Patentability for PCT Patent Application No. PCT/US2004/026401, mailed on Dec. 21, 2006, 7 pages.
Office Action received for European Patent Application No. 04781137.7, mailed on Aug. 12, 2010, 4 pages.
Office Action received for European Patent Application No. 04781137.7, mailed on May 17, 2011, 3 pages.
Search Report received for European Patent Application No. 12000867.7, mailed on Nov. 2, 2012, 7 pages.
Search Report received for European Patent Application No. 12000868.5, mailed on Nov. 2, 2012, 6 pages.
Search Report received for European Patent Application No. 12000869.3, mailed on Nov. 2, 2012, 7 pages.
Search Report received for European Patent Application No. 12000870.1, mailed on Nov. 2, 2012, 7 pages.
Office Action received for Chinese Patent Application No. 200480023188.6, mailed Feb. 5, 2010, 8 pages. Includes 3 pages of English translation.
Office Action received for Chinese Patent Application No. 200480023188.6, mailed Mar. 20, 2009, 12 pages. Includes 5 pages of English translation.
Office Action received for Chinese Patent Application No. 200480023188.6, mailed May 12, 2010, 7 pages. Includes 3 pages of English translation.

* cited by examiner

METHOD OF MANUFACTURING A CIRCUIT BOARD

CROSS-REFERENCE TO RELATED APPLICATION

This application is a continuation of application Ser. No. 13/859,421 filed Apr. 9, 2013 (now U.S. Pat. No. 8,673,391, which is a divisional of application Ser. No. 12/723,949 filed Mar. 15, 2010 (now U.S. Pat. No. 8,415,002), which is a division of application Ser. No. 11/727,279 filed Mar. 26, 2007 (now U.S. Pat. No. 7,676,917), which is a divisional of application Ser. No. 10/641,070 filed Aug. 15, 2003 (now U.S. Pat. No. 7,459,200), the entire contents of which are hereby incorporated by reference as though fully set forth herein.

BACKGROUND OF THE INVENTION

The present invention relates to circuit board design. More particularly, the present invention relates to improving circuit boards to improve electrical performance thereof.

Circuit boards, which include printed circuit boards or PCBs, are common in the industry for electrically connecting components in a single unit. The most common type of printed circuit board is made of a material referred to in the art as FR4. This type of circuit board is relatively inexpensive to manufacture. It is made up of a rectangular grid or cloth of fiberglass fibers that are typically bonded to a copper substrate using an epoxy resin. Also, the fiberglass cloth can be impregnated with the epoxy resin. A fire retardant (FR) is added to the board, so that the board may be subjected to high-heat environments (e.g., when soldering components to the board). Electrical conductors (e.g., made of copper) are deposited in or on either side of the board and transmit signals between components (e.g., integrated circuit chips) on the boards, sockets for the insertion of other circuit boards (e.g. a daughter card inserted into a motherboard), etc. In the art, the material used for FR4 circuit boards has been effective at reducing crosstalk between signal lines.

FR4 circuit boards are also used to transmit signals in differential point to point interfaces. In such an interface, two signal line traces are provided to transmit one data signal. A first one of the traces transmits a part of the data signal that is 180° out-of-phase with the other part of the data signal transmitted on the second one of the traces. At the receiving end of the two signal line traces, the two out-of-phase signals are differentiated so as to recreate the original data transmitted in the signals. Signal trace pairs are often used in bus architectures.

FR4 has been successfully used for the transmission of differential signals at current operating frequencies. As components, including processors, increase in operating frequency, problems may occur in the use of FR4 for the circuit board material. For example, as bus frequencies increase over 1 GHz (gigahertz or 1 billion cycles per second), differential to common mode conversion may become a problem for a signal trace pair. In this conversion, the phase difference between the first and second traces changes from the optimal 180° described above. If the phase difference drops below a certain threshold, the receiving device will be unable to differentiate the two signals to retrieve the original data signal. Though such conversion occurs in FR4 circuit boards, the level of conversion has not been a factor at lower frequencies. At higher frequencies, this conversion may become severe, negating the use of known FR4 circuit boards.

One solution to this problem is to replace the FR4 board with a different, and perhaps homogenous, material. Such boards are known in the art, but are generally more expensive than the common FR4 material.

In view of the above, there is a need for an improved circuit board material.

DETAILED DESCRIPTION

Figure 1:
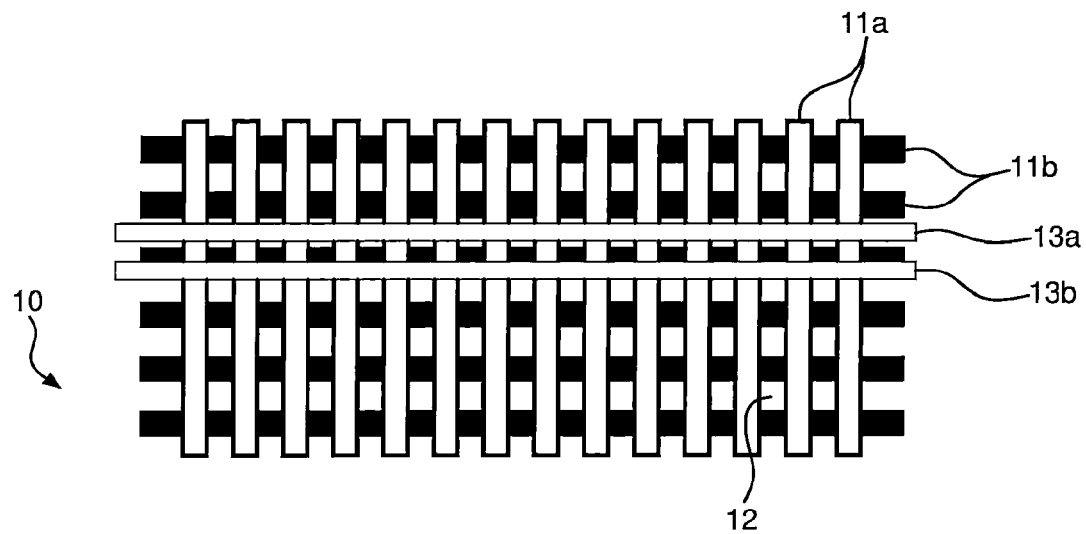
FIG. 1 is a schematic representation of the use of FR4 circuit board with a rectangular lattice structure and a pair of signal traces.

Referring to FIG. 1, a representation of a portion of an FR4 board with a pair of signal traces is shown. The circuit board 10 includes vertical and horizontal fiberglass fibers 11a, 11b, respectively. Though one rectangular lattice structure is shown, multiple such lattice structures may be provided in the circuit board 10. The circuit board 10 also includes a resin 12, such as an epoxy resin, which is disposed throughout the rectangular lattice structure of the fiberglass fibers 11a-b. In the board of FIG. 1, a pair of signal line traces 13a, 13b are provided. In this example, the signal lines are generally parallel to the horizontal fiberglass fibers 11b. These signal traces may be embedded into the resin, disposed on top of the resin of the circuit board, etc. As seen in FIG. 1, the first signal line 13a is generally disposed between adjacent horizontal fibers 11b. In this example each signal line trace has a width of approximately 5 mils (i.e., 5 milli-inches or 0.005 inches). The second signal line 13b, however, is generally disposed over one of the horizontal fibers 11b. The spacing between the traces is 5 mils in this example.

When using the first and second signal line traces for differential signaling, it is desirable to have these traces be equivalent in terms of characteristic impedance and propagation constant. With low signal frequencies, the effect of the non-homogeneous material of the FR4 circuit board is negligible on these features of the signal traces. As signal frequency increases, however, differences in the material composition near the signal traces has a considerable effect on these features. At high signal frequencies, these features will have an effect on the magnitude and phase of the signals transmitted by the trace. If the circuit board material affects the characteristic impedance and/or propagation constant in these traces differently, then determining the difference between the signals in these traces becomes more difficult and could result in loss of the data desired to be transmitted.

In the example of FIG. 1, the board material near the second trace 13b has a relatively high ratio of fiberglass-to-resin material, while the board material near the first trace 13a is made up of a much lower ratio of fiberglass-to-resin material. At a signal frequency of 604 MHz (i.e., 604 Million Hertz or 604 Million cycles-per-second), a 5 mil wide trace of an FR4 circuit board has a dielectric constant $E_r$ that varies between 3.32 and 3.50. With two signal line traces having a width of 5 mils and a spacing of 5 mils, it is estimated that total mode conversion of differential to common mode (i.e., complete signal loss) will occur at 3.5 GHz for 30-inch trace lengths due to the accumulated phase shift between the pair.

Figure 2:
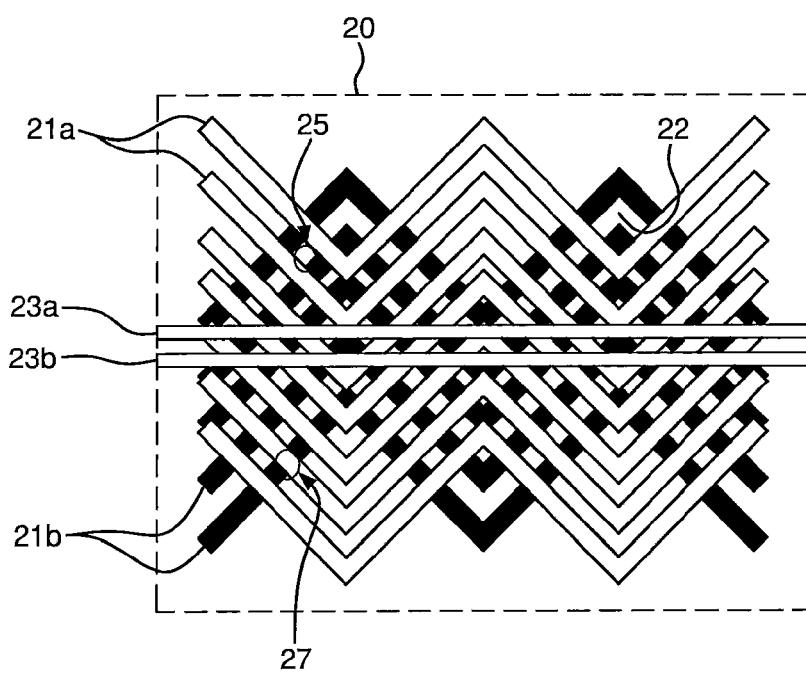
FIG. 2 is a schematic representation of the use of FR4 circuit board with a zig-zag or herringbone lattice structure and a pair of signal traces.

According to an embodiment of the present invention, a circuit board is fabricated using the same types of materials contemplated for FR4 circuit boards. A representation of this embodiment is shown in FIG. 2. Referring to FIG. 2, in the portion of the circuit board 20 shown, first and second fiberglass fiber sets 21a, 21b overlap each other. These sets form a zig-zag or herringbone design in this embodiment. In other words, each fiberglass set is characterized by straight line segments connected by vertices (e.g., as in a periodic, triangular wave-form). Though two sets of fiberglass fibers are shown, one or more such sets may be provided. As in the FR4 circuit board, a resin is added to form the circuit board structure. As with the FR4 circuit boards known in the art, there will be areas where the ratio of resin material to fiberglass material will be relatively high (e.g., at area 25) and areas where this ratio will be relatively low (e.g., at area 27). Again, two signal line traces 23a, 23b are disposed in or on the circuit board 20. As seen in FIG. 2, the circuit board material residing near the signal line traces 23a, 23b is a mixture of different ratios between the resin and fiberglass materials. The effect, in this embodiment, is that the material near the first signal line trace 23a will be similar, overall, in content compared to the material near the second signal line trace 23b. Since the materials near first and second signal line traces 23a, 23b are similar, overall, there is less differential to common mode conversion when using these traces for differential mode signaling.

In the embodiment of FIG. 2, the fiberglass material is formed in a zig-zag or herringbone design. The spacing between adjacent fibers may be similar to that of the fiberglass lattice of FIG. 1—approximately 5 mils. As signal frequencies increase and signal trace width decreases, the density (i.e., thickness and spacing) of the fiberglass material lattice may be adjusted so as to reduce differential to common mode conversion in signal line pairs.

The rectangular lattice for the fiberglass cloth used in the circuit board 10 of FIG. 1 is made in a conventional manner. The cloth is made by taking fiberglass fibers and weaving them together or interleaving horizontal fibers and vertical fibers. To make the zig-zag or herringbone design of FIG. 2 may be implemented by modifying systems that currently manufacture fiberglass cloth. For example, in creating the first set 21a of fiberglass fibers, the apparatus emitting the fiberglass fibers can be moved side-to-side as the fibers are laid down onto a surface. Alternatively, the surface upon which the fibers are laid can be moved side-to-as the fibers are laid down. Once the zig-zag or herringbone fiberglass fiber is made, it can be adhered to a copper substrate with an epoxy resin as with standard FR4 manufacturing methods. Accordingly, signal line traces 23a, 23b may be formed by removing unwanted copper from the circuit board in a conventional manner.

The embodiment of the present invention shown in FIG. 2 may be made at a low-cost similar to conventional FR4 circuit boards that are currently available. The manufacture of the board of FIG. 2 may use much of the same equipment as is used in the manufacture of conventional FR4 circuit boards.

Figure 3:
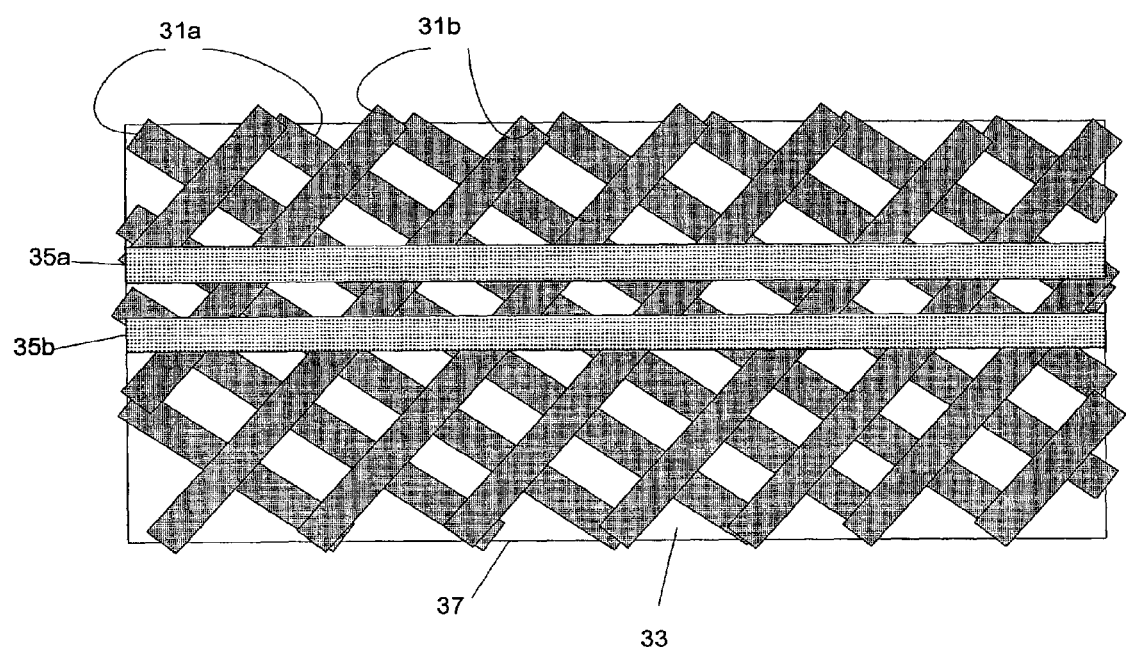
FIG. 3 is a schematic representation of the use of modified FR4 circuit board and a pair of signal traces according to an embodiment of the present invention.

Another embodiment of the present invention is shown in FIG. 3. In FIG. 3, an FR4 circuit board is made in a conventional manner. In other words, a fiberglass cloth of horizontal and vertical fiberglass fibers 31a, 31b are provided in an epoxy resin 33. After the fiberglass fibers and resin are formed together the entire apparatus is rotated and then cut to size. For example, in FIG. 3, the fiberglass lattice is rotated 45° (i.e., either the horizontal fiberglass fibers or the vertical fibers form a non-right angle of 45° with cut line). When placing two conductive traces 35a, 35b onto the circuit board 37, it can be readily seen that both conductors pass by areas of higher fiberglass-to-resin material and lower fiberglass-to-resin material, thus assisting in reducing differential to common mode conversion between signals in the two conductive traces.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

Figure 4A:
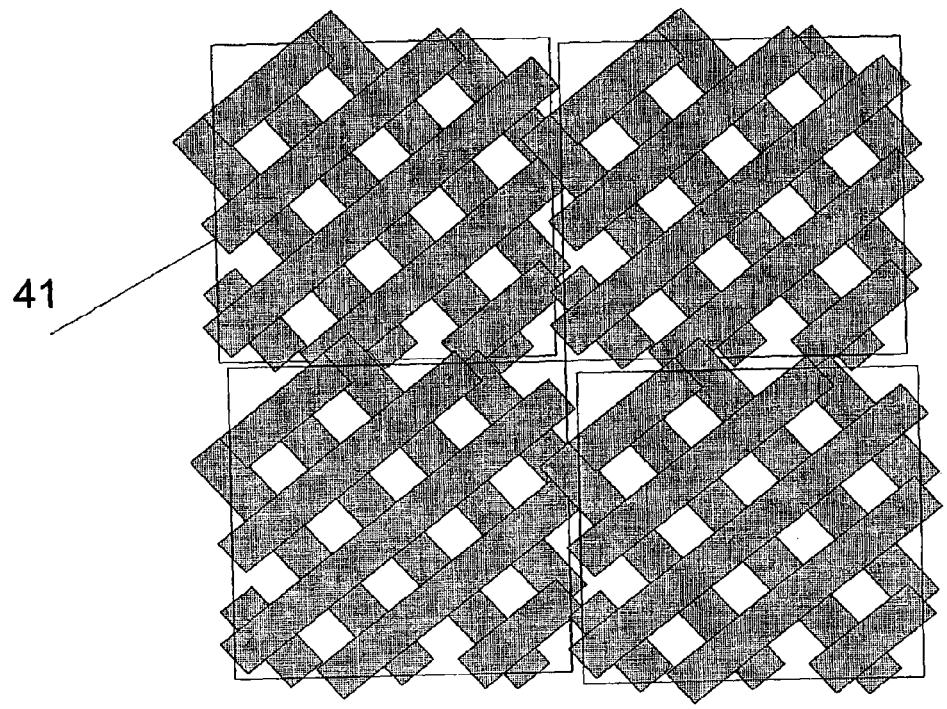
FIGS. 4a-c are schematic representations of an embodiment of the present invention for manufacturing a circuit board using portions of an FR4 circuit board.
Figure 4B:
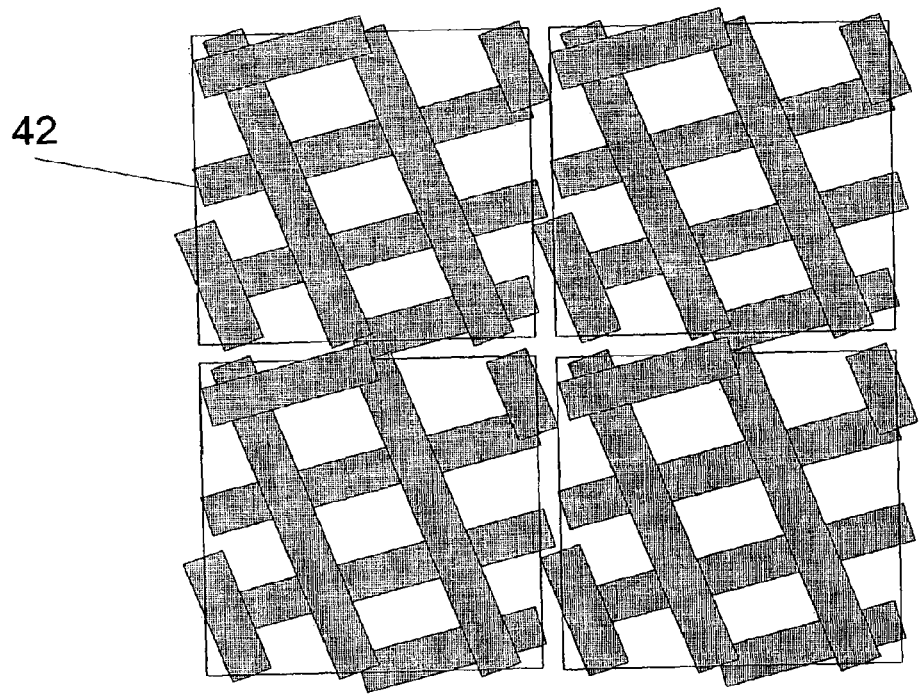
Figure 4C:
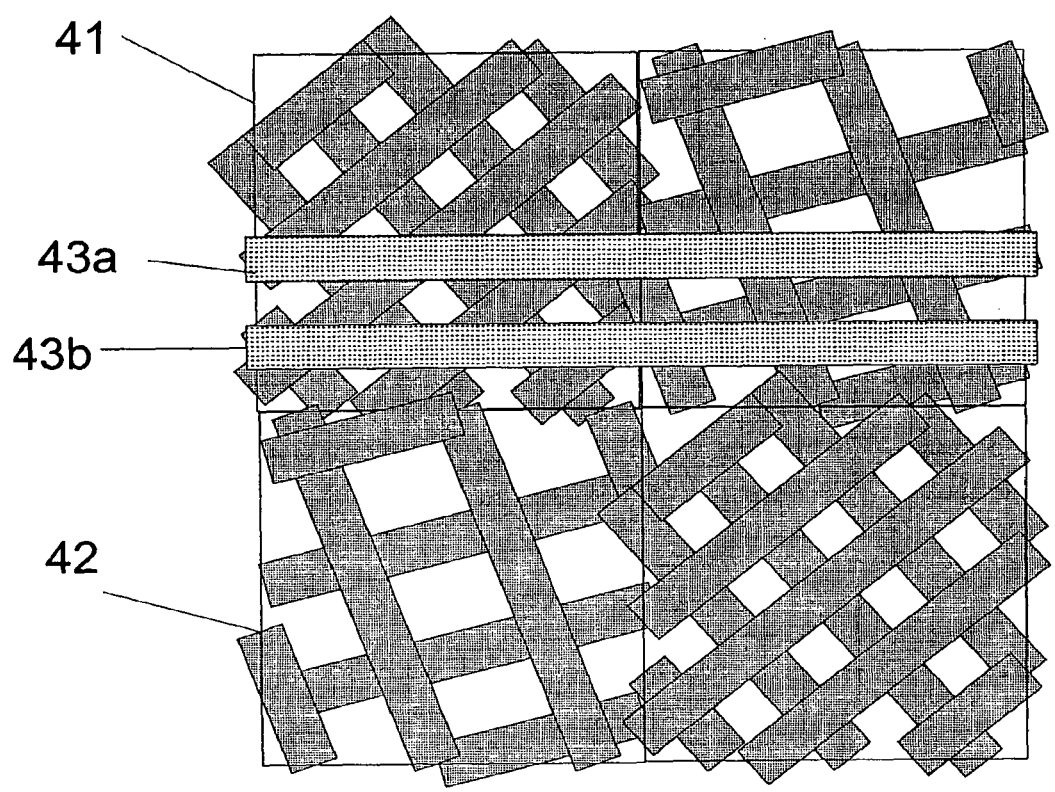

For example, one or more conventional FR4 boards may be rotated (e.g., by 45°) and sliced into a number of squares. The individual squares from the board(s) can then be rotated again to desired orientations and reformed together. An example of this is shown in FIGS. 4a-c. In FIG. 4a, an FR4 board is rotated 30° and sliced into a number of sections or squares 41. In FIG. 4b, a second FR4 board is rotated 45° and sliced into a number of squares 42. The individual squares can then be rotated if desired, and then reformed together to form a new FR4 board with conductors 43a, 43b.

Though the embodiment of FIGS. 4a-c is shown with rectilinear shapes, other shapes may be used. Also, as shown in FIGS. 4a-c, the density of the fiberglass fibers need not be the same between the sections used to create the new FR4 board.

What is claimed is:

1. A method of manufacturing a circuit board comprising:
   adding a resin;
   forming first and second fiberglass fibers; and
   forming first and second signal line traces capable of transmitting electrical signals; wherein a ratio between fiberglass and resin material near the first signal line trace is
similar to a ratio between fiberglass and resin material near the second signal line trace, and a shape formed between the first and second signal line traces when crossing near the first and second fiberglass is in a non-rectilinear shape, and
   wherein the first and second signal line traces are to be used to conduct differential mode signaling.

2. The method of manufacturing a circuit board of claim 1, wherein the resin is an epoxy resin.

3. The method of manufacturing a circuit board of claim 1, wherein the first and second fiberglass fibers form a non-right angle with a cut line of the circuit board.

4. The method of manufacturing a circuit board of claim 1, wherein the first and second signal line traces pass by areas of higher fiberglass-to-resin material and areas of lower fiberglass-to-resin material to assist in reducing differential to common mode conversion between signals on the first and second signal line traces.

5. The method of manufacturing a circuit board of claim 1, wherein the first and second signal line traces are a pair of differential signal line traces.

6. The method of manufacturing a circuit board of claim 1, wherein the first and second signal line traces are capable of transmitting electrical signals at one gigahertz and above.

7. The method of manufacturing a circuit board of claim 1, wherein the ratio between fiberglass and resin material near the first signal line trace is an overall ratio between fiberglass and resin material near an entire portion of the first signal line trace and wherein the ratio between fiberglass and resin material near the second signal line trace is an overall ratio between fiberglass and resin material near an entire portion of the second signal line trace.

* * * * *